United States Patent
Pitkethly et al.

(10) Patent No.: US 7,375,556 B1
(45) Date of Patent: May 20, 2008

(54) ADVANCED REPEATER UTILIZING SIGNAL DISTRIBUTION DELAY

(75) Inventors: Scott Pitkethly, Redwood City, CA (US); Robert Paul Masleid, Monte Sereno, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 11/171,845

(22) Filed: Jun. 30, 2005

Related U.S. Application Data

(63) Continuation-in-part of application No. 10/879,807, filed on Jun. 28, 2004, now Pat. No. 7,142,018, and a continuation-in-part of application No. 10/864,271, filed on Jun. 8, 2004.

(51) Int. Cl.
*H03K 19/0175* (2006.01)
*H03K 19/094* (2006.01)

(52) U.S. Cl. .............................. 326/86; 326/23; 326/27
(58) Field of Classification Search ................. 326/86, 326/83, 23, 27
See application file for complete search history.

(56) References Cited

U.S. PATENT DOCUMENTS

| | | | |
|---|---|---|---|
| 4,498,021 A * | 2/1985 | Uya ............................ | 326/86 |
| 5,166,555 A | 11/1992 | Kano | |
| 5,414,312 A | 5/1995 | Wong | |
| 5,455,521 A | 10/1995 | Dobbelaere | |
| 5,497,105 A | 3/1996 | Oh et al. | |
| 5,698,994 A * | 12/1997 | Tsuji ........................... | 326/83 |
| 5,739,715 A | 4/1998 | Rawson | |
| 5,767,700 A | 6/1998 | Lee | |
| 5,969,543 A | 10/1999 | Erickson et al. | |
| 6,025,738 A | 2/2000 | Masleid | |
| 6,114,840 A | 9/2000 | Farrell et al. | |
| 6,172,545 B1 | 1/2001 | Ishii | |
| 6,262,601 B1 | 7/2001 | Choe et al. | |
| 6,321,282 B1 | 11/2001 | Horowitz et al. | |
| 6,573,777 B2 | 6/2003 | Saint-Laurent et al. | |
| 6,577,176 B1 | 6/2003 | Masleid et al. | |
| 6,731,140 B2 | 5/2004 | Masleid et al. | |
| 2001/0000426 A1 * | 4/2001 | Sung et al. ................... | 331/25 |
| 2001/0030561 A1 | 10/2001 | Asano et al. | |
| 2002/0056016 A1 | 5/2002 | Horowitz et al. | |
| 2003/0057775 A1 | 3/2003 | Yamashita et al. | |
| 2003/0160630 A1 | 8/2003 | Earle | |
| 2003/0231713 A1 | 12/2003 | Masleid et al. | |

FOREIGN PATENT DOCUMENTS

| | | | |
|---|---|---|---|
| JP | 03089624 A | * | 4/1991 |
| JP | 04091516 A | | 3/1992 |

OTHER PUBLICATIONS

Ryohei Kaneda, Translation of Japanese Kokai Patent Application No. HEI 3[1991]-89624, publication date: Apr. 15, 1991, pp. 1-6.*

(Continued)

*Primary Examiner*—Daniel Chang

(57) ABSTRACT

An advanced repeater utilizing signal distribution delay. In accordance with a first embodiment of the present invention, such an advanced repeater circuit comprises an output stage for driving an output signal line responsive to an input signal and a feedback loop coupled to said output signal line for changing state of said output stage subsequent to a delay after a transition of said output signal. The delay is due to transmission line effects of said output signal line.

23 Claims, 2 Drawing Sheets

OTHER PUBLICATIONS

Iima, et al., Capacitance Coupling Immune, Treatment Senstive Accelerator for Resistive Interconnect Signals of Subquarter Micron ULSI, Apr. 1996, IEEE Journal of Solid-State Circuits, vol. 31, No. 4, pp. 531-536.

Nalamalpu. Et al., Boosters For Driving Long Onchip Interconnects-Design Issues, Interconnect Synthesis, and Comparison with Repeaters, Jan. 2002, IEEE Transactions on Computer-Aided Design of Integrated Circuits and Systems, vol. 21, No. 1, pp. 50-62.

* cited by examiner

ADVANCED REPEATER UTILIZING SIGNAL DISTRIBUTION DELAY

RELATED APPLICATIONS

This Application is a Continuation-in-Part of co-pending, commonly owned U.S. patent application Ser. No. 10/864,271, filed Jun. 8, 2004, entitled "Stacked Inverter Delay Chain" to Masleid and Burr, which is hereby incorporated herein by reference in its entirety.

This Application is a Continuation-in-Part of co-pending, commonly owned U.S. patent application Ser. No. 10/879,807, filed Jun. 28, 2004, now U.S. Pat. No. 7,142,018, entitled "Circuits and Methods for Detecting and Assisting Wire Transitions" to Masleid and Kowalczyk, which is hereby incorporated herein by reference in its entirety.

BACKGROUND OF THE INVENTION

1. Field of the Invention

Embodiments of the present invention relate to advanced repeaters.

2. Related Art

A vital area of circuit performance is the propagation time of signals, for example synchronization or "clock" signals, across an integrated circuit. Longer wires in integrated circuits resist the propagation of signals due to the resistance and capacitance of the wire. The propagation of signals across a chip can be improved by inserting an amplification circuit, sometimes referred to as buffering or repeater insertion, into the wire.

SUMMARY OF THE INVENTION

Accordingly, a repeater circuit would be advantageous. Embodiments in accordance with the present invention provide an advanced repeater utilizing signal distribution delay.

An advanced repeater utilizing signal distribution delay is disclosed. In accordance with a first embodiment of the present invention, an advanced repeater circuit includes an output stage for driving an output signal line responsive to an input signal and a feedback loop coupled to the output signal line for changing state of the output stage subsequent to a delay after a transition of the output signal. The delay may be due to transmission line effects of the output signal line.

In accordance with another embodiment of the present invention, a method of assisting signal transitions includes receiving a transition at a circuit input and driving an output signal line responsive to the transition. Subsequent to a delay after a transition of the output signal line, the output signal line ceases to be driven. The delay may be produced substantially by transmission line effects of the output signal line.

BRIEF DESCRIPTION OF THE DRAWINGS

The accompanying drawings, which are incorporated in and form a part of this specification, illustrate embodiments of the present invention and, together with the description, serve to explain the principles of the invention. The drawings referred to in this description should not be understood as being drawn to scale except if specifically noted.

DETAILED DESCRIPTION OF THE INVENTION

Figure 1:
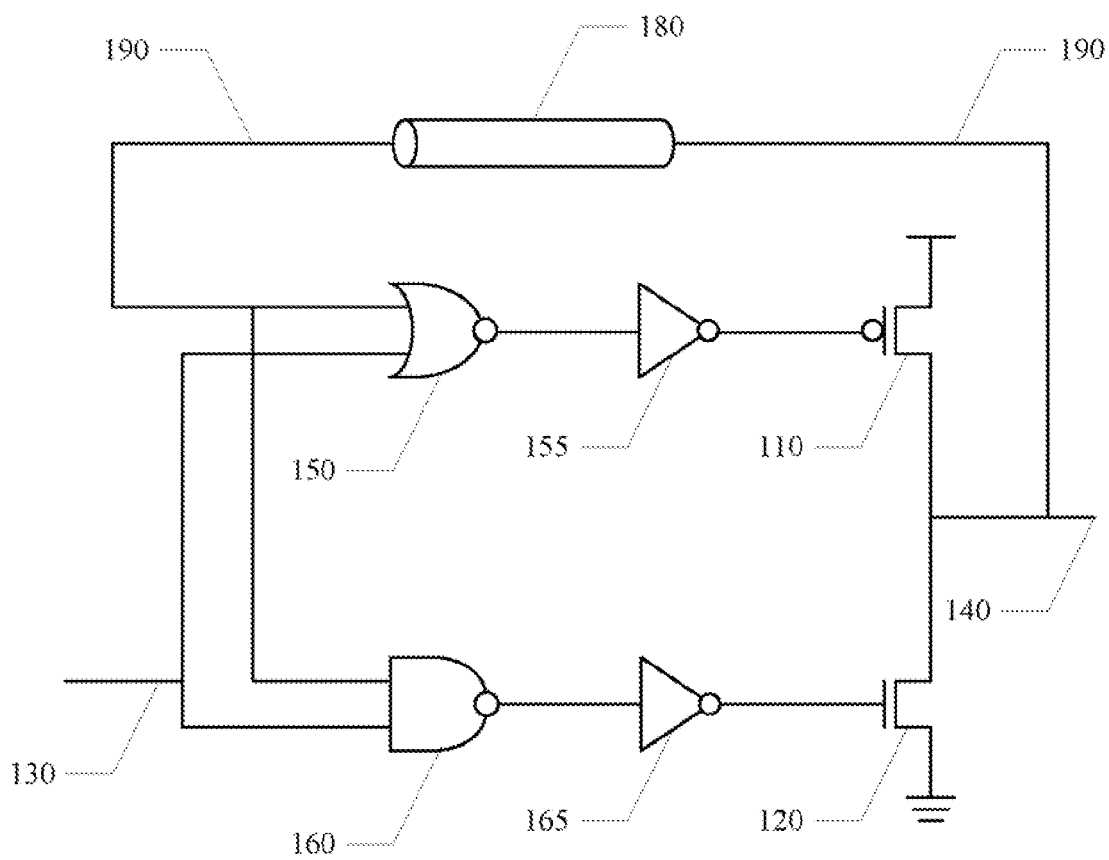
FIG. 1 illustrates a schematic of one embodiment of a circuit for driving signals on a wire and for assisting signal transitions, in accordance with embodiments of the present invention.

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

During the layout of an integrated circuit chip design, repeater circuits are inserted at periodic intervals along long metal wires in order to amplify signals (or remove distortion) as well as to reduce propagation delay (or maintain fast transition times). Synchronization timing or "clock" signal distribution networks, e.g., "clock trees," frequently utilize such repeaters. Typically, there is a wide selection of repeater circuits available to the integrated circuit designer.

Conventional, or "classic" repeater circuits generally comprise relatively single amplifier circuits. An amplifier circuit receives a transition and actively drives its output to the new voltage state. A problem with such conventional repeaters is that, after helping achieve one transition, such circuits continue to drive the wire and thus resist the next transition.

A second general classification of a repeater circuit design is known as or referred to as an "advanced" repeater. An advanced repeater circuit generally utilizes a delayed version of the input signal in order to limit the duration that the output portion of the advanced repeater fully drives the output line. By limiting the "full drive" duration, the advanced repeater may enhance the propagation of a signal without resisting subsequent transitions.

One difficulty in designing advanced repeater circuits is selecting and controlling the duration of the delay. In order to ensure a high-quality waveform, the delay should be long enough for the output to transition to the power supply rail, e.g., be strongly driven. However, the delay should further be short enough such that the output driver turns off prior to the arrival of a subsequent input clock edge. Straightforward delay-generation techniques, e.g., a series of inverter elements, are frequently used to generate such delays in advanced repeater circuits.

Unfortunately, however, the delay durations generated by such delay-generation techniques suffer from both intentional and unavoidable variations in circuit operation due to such factors as manufacturing process variations and the effects of operating temperature and operating voltage variations. For example, if the delay becomes too short, e.g., due to variation in operating conditions, the output driver(s) may not have enough time to drive the output to the desired state. Additionally, the use of a plurality of circuit elements to achieve a desirable target delay may undesirably increase circuit complexity, cost and/or power consumption while deleteriously decreasing wireability.

FIG. 1 illustrates a schematic of one embodiment of a circuit 100 for driving signals on a wire and for assisting signal transitions, in accordance with embodiments of the present invention. Circuit 100 can be coupled to a signal wire to function as a wire repeater or accelerator. As will be seen, circuit 100 provides the capability to detect a transition (e.g., a rising transition or falling transition) occurring on the wire and assist the transition, and then drive the wire after the transition without resisting a subsequent transition.

In the embodiment of FIG. 1, circuit 100 has an input node 130 and an output node 140 that are each coupled to the wire.

In general, circuit 100 of FIG. 1 includes three sections referred to herein as driver circuitry, control circuitry, and feedback loop. In the example of FIG. 1, the driver circuitry includes p-type device 110 and n-type device 120. NOR gate 150 and inverter 155 control p-type device 110 based upon input node 130 and a feedback loop input. It is appreciated that devices 150 and 155 in the present configuration form a logical OR gate or function. Similarly, NAND gate 160 and inverter 165 similarly control n-type device 120 based upon input node 130 and the feedback loop input. It is appreciated that devices 160 and 165 in the present configuration form a logical AND gate or function.

It is to be appreciated that feedback loop 190 is formed between output node 140 and the feedback inputs of devices 150 and 160.

Conventionally, feedback loop 190 may be schematically represented as an uninterrupted signal line, e.g., a direct connection between output node 140 and the feedback inputs of devices 150 and 160. However, such a schematic representation does not identify the high frequency physical effects influencing feedback loop 190. Consequently, feedback loop 190 is illustrated in FIG. 1 with lumped transmission line effects 180. It is to be appreciated that transmission line effects on feedback loop 190, shown as lumped transmission line effects 180, will introduce a delay between output node 140 and the feedback inputs of devices 150 and 160.

Exemplary operation of circuit 100 will now be described, assuming an initial condition of a low on input node 130 and a high on output node 140. In a steady-state condition, the high on output node 140 will have propagated to the feedback inputs of NOR 150 and NAND 160.

Responsive to a low to high transition on input node 130, there will be two high inputs to NAND 160 that ultimately turn on n-type device 120. Similarly, there will be two high inputs to NOR 150 that ultimately turn p-type device 110 off. Consequently, output node 140 will transition from high to low, being actively driven by n-type device 120.

The high to low transition on output node 140 will propagate through feedback loop 190. This transition will be delayed by transmission line effects on feedback loop 190, shown as lumped transmission line effects 180, ultimately reaching the feedback inputs of NOR 150 and NAND 160.

Responsive to the high to low transition on the feedback inputs of NOR 150 and NAND 160, both n-type device 120 and p-type device 110 will be turned off.

It is to be appreciated that output node 140 will tend to remain in its previous state, e.g., low in the previous example, even when not actively driven, e.g., when both n-type device 120 and p-type device 110 have been turned off. In accordance with alternative embodiments of the present invention, relatively weak "keeper" or "hold" circuitry may be utilized to hold output node 140 in a steady state.

For example, such keeper circuitry may operate at a reduced drive strength relative to the rising and falling transition circuitry. The keeper circuitry maintains the state at the output node 140 in between operation of the transistors 110 and 120. That is, the keeper circuitry maintains a high state at output node 140 after transistor 110 is shut off (and before transistor 120 is turned on), and also maintains a low state at output node 140 after transistor 120 is turned off (and before transistor 110 is turned on).

Co-pending, commonly owned U.S. patent application Ser. No. 10/879,807, filed Jun. 28, 2004, entitled "Circuits and Methods for Detecting and Assisting Wire Transitions" to Masleid and Kowalczyk, incorporated herein by reference in its entirety, illustrates exemplary circuits and methods of such "keeper" circuitry suitable for inclusion with embodiments of the present invention.

Utilization of a signal's own distribution delay as a control input in an advanced repeater type of signal buffer presents several advantages in comparison to the conventional art. For example, no additional, dedicated circuitry is required to generate the delay. Such a decrease in circuitry in comparison to the conventional art advantageously reduces cost and power consumption while also improving wireability.

It is to be appreciated that the delay should be sufficient for each drive transistor, e.g., transistors 110 and 120 (or set of drive transistors), to be able to drive the output network, represented by output node 140, to a desirable level. For example, if the delay is too short, the output network may not achieve a level consistent with the technology's defined levels. Likewise, if the delay is too long, the output driver will fail to shut off prior to the subsequent transition, effectively reducing the output drive strength and limiting the operating frequency of the circuit.

In yet another advantage of embodiments in accordance with the present invention, there will, in general, be a convenient signal node endpoint nearby with sufficient delay for use as the feedback input, since in most cases a clock distribution network or tree conforms to a uniform and ubiquitous set of endpoints.

In addition, there are numerous electrical advantages. For example, since the delay is generated by the signal distribution network, the delay inherently tracks changes in the signal distribution. For example, if due to process variation the signal is distributed in a "fast" manner, the delay will be similarly affected and consequently reduced, enabling such "fast" signals.

Figure 2:
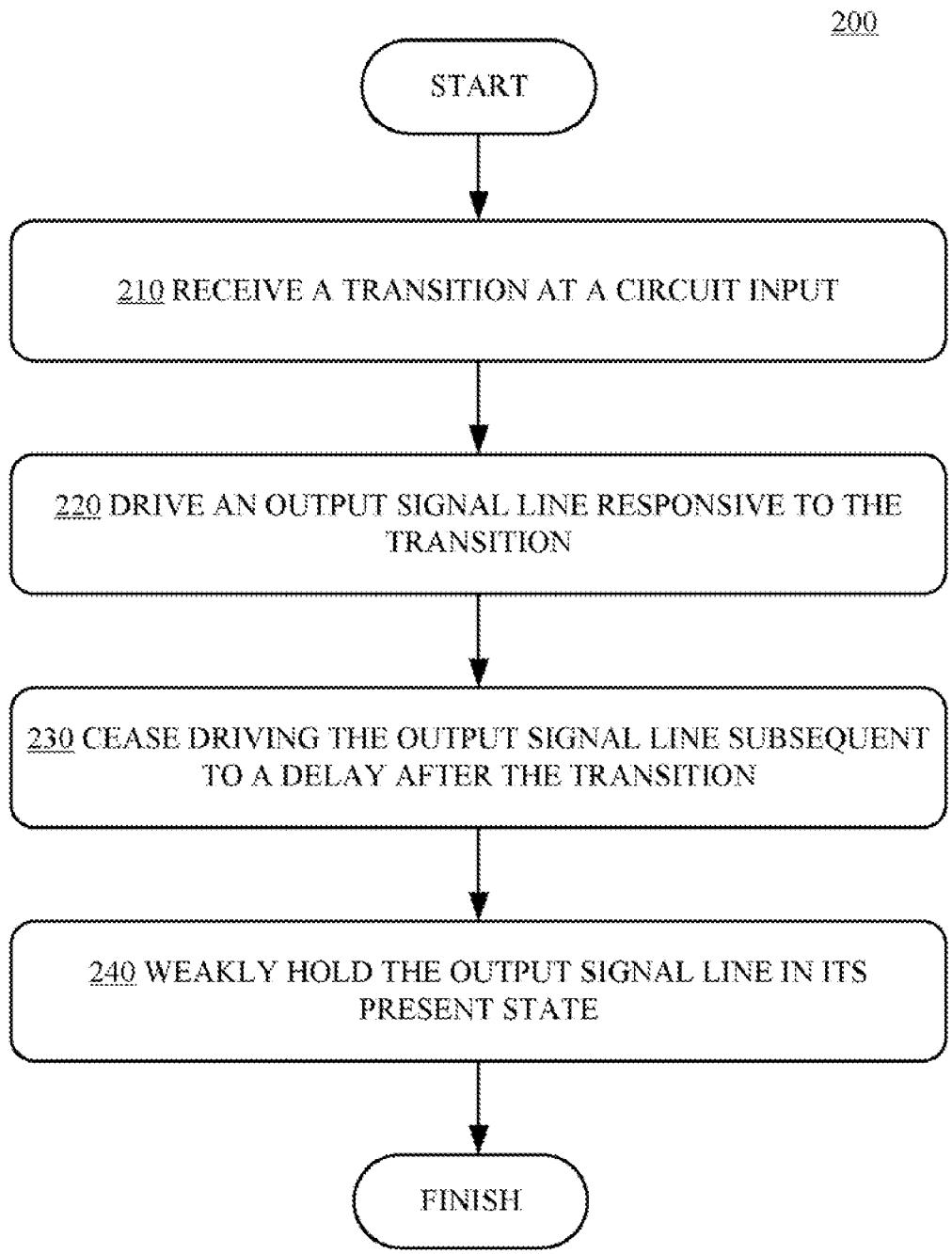
FIG. 2 illustrates a method for assisting signal transitions, in accordance with embodiments of the present invention.

FIG. 2 illustrates a method 200 for assisting signal transitions, in accordance with embodiments of the present invention. In 210, a transition is received at a circuit input. For example, a low to high transition is received at input node 130 as shown in FIG. 1.

In 220, an output signal line is driven responsive to the transition. For example, the low to high transition received at input node 130 propagates though the control circuitry of circuit 100 to cause n-type device 120 to turn on, driving output node 140 to a low level.

In 230, the driving ceases subsequent to a delay after the transition of the output signal line. The delay is produced substantially by transmission line effects of the output signal line. For example, the high to low transition on output node 140 propagates through feedback loop 190 and causes n-type device 120 to turn off after a delay.

It is appreciated that other circuitry may hold the output signal line in its present state subsequent to the cessation of driving, in accordance with alternative embodiments of the present invention. In optional 240, the output signal line is weakly held in its present state.

In summary, embodiments of the present invention provide circuits (e.g., wire accelerators and repeaters), and methods thereof, for assisting signal transitions on a wire (such as a wire on an integrated circuit). Circuit embodiments in accordance with the present invention can both drive a signal on the wire and assist during wire transitions, without resisting the transitions.

Embodiments in accordance with the present invention are thus described. While the present invention has been described in particular embodiments, it should be appreciated that the present invention should not be construed as limited by such embodiments, but rather construed according to the below claims.

What is claimed is:

1. A circuit for assisting signal transitions on a wire, said circuit comprising:
    an output stage for driving an output signal over an output signal line responsive to an input signal and for stopping said driving of said output signal after a delay; and
    said output signal line coupled as a feedback loop between an output and an input of said output stage, wherein said delay is due substantially to transmission line effects of said output signal line.

2. The circuit of claim 1 wherein said output signal is inverted relative to said input signal.

3. The circuit of claim 1 wherein a first state of said output stage comprises a high level drive and a second state of said output stage comprises a substantially weaker level drive.

4. The circuit of claim 3 wherein said second state of said output stage comprises a keeper mode.

5. The circuit of claim 3 wherein said substantially weaker level drive comprises substantially no drive.

6. The circuit of claim 1 wherein said input signal is a synchronization clock.

7. The circuit of claim 1, wherein said output signal line comprises a signal distribution network or tree.

8. The circuit of claim 1, wherein said output signal line coupled as a feedback loop comprises coupling a node endpoint of said signal distribution network or tree to said input of said output stage.

9. The circuit of claim 1, wherein said delay is long enough to drive said output signal to a given level and short enough not to resist a next transition of said output signal.

10. The circuit of claim 9, wherein said delay is short enough that said driving stops prior to a next transition of said input signal.

11. A method of assisting signal transitions, said method comprising:
    receiving a transition of an input signal;
    driving an output signal to a given state in response to said transition of said input signal; and
    ceasing driving said output signal in response to a transition of said output signal after a delay, wherein said delay is generated by transmission of said output signal along a signal distribution network or tree.

12. The method of claim 11 further comprising weakly holding said output signal in its present state.

13. The method of claim 11 wherein a duration of said delay is sufficient for driving said output signal to a desired level.

14. The method of claim 11 wherein said output signal is inverted relative to said input signal.

15. The method of claim 11 wherein said ceasing comprises a change in stage of combinatorial logic.

16. The method of claim 11 wherein said receiving, said driving and said ceasing are performed by an integrated circuit.

17. The method of claim 16 wherein said receiving, said driving and said ceasing are performed by a microprocessor.

18. A circuit for assisting signal transitions on a wire, said circuit comprising:
    a first transistor for driving an output node high;
    a second transistor for driving said output node low;
    an OR gate, for controlling said first transistor, having a first input coupled to an input signal;
    an AND gate, for controlling said second transistor, having a first input coupled to said input signal; and
    a transmission line effects feedback loop directly connected between said output node and second inputs of said OR gate and said AND gate.

19. The circuit of claim 18 wherein said OR gate comprises a NOR gate and an inverter.

20. The circuit of claim 18 wherein said AND gate comprises a NAND gate and an inverter.

21. The circuit of claim 18 wherein transmission line effects feedback loop is a clock signal distribution network or tree.

22. The circuit of claim 21 wherein a duration of a delay generated by said clock signal distribution network or tree is sufficient for said first transistor to drive said output signal line high.

23. The circuit of claim 22 embodied in a microprocessor.

* * * * *